United States Patent [19]
Nishida et al.

[11] Patent Number: 5,403,771
[45] Date of Patent: Apr. 4, 1995

[54] PROCESS FOR PRODUCING A SOLAR CELL BY MEANS OF EPITAXIAL GROWTH PROCESS

[75] Inventors: Shoji Nishida, Fujisawa; Takao Yonehara, Atsugi, both of Japan

[73] Assignee: Canon Kabushiki Kaisha, Tokyo, Japan

[21] Appl. No.: 190,584

[22] Filed: Feb. 2, 1994

Related U.S. Application Data

[63] Continuation of Ser. No. 920,497, Sep. 28, 1992, abandoned.

[30] Foreign Application Priority Data

Dec. 26, 1990 [JP] Japan .................................. 2-413874

[51] Int. Cl.⁶ .................... H01L 21/20; H01L 21/3205
[52] U.S. Cl. .......................................... 437/89; 437/4; 437/109; 136/258
[58] Field of Search ................. 437/2, 4, 89, 228, 109; 136/258

[56] References Cited

U.S. PATENT DOCUMENTS

| | | |
|---|---|---|
| 4,431,858 | 2/1984 | Gonzalez et al. . |
| 4,816,420 | 3/1989 | Bozler et al. . |
| 5,094,697 | 3/1992 | Takabayashi et al. . |
| 5,139,970 | 8/1992 | Yamazaki . |
| 5,155,051 | 10/1992 | Noguchi et al. . |

FOREIGN PATENT DOCUMENTS

| | | |
|---|---|---|
| 63-182872 | 7/1988 | Japan . |
| 3160763 | 7/1991 | Japan . |
| 2113465 | 8/1983 | United Kingdom . |

OTHER PUBLICATIONS

Wada et al., Journal of Electrochemical Society, vol. 125, 1499 (1978).

*Primary Examiner*—George Fourson
*Attorney, Agent, or Firm*—Fitzpatrick, Cella, Harper & Scinto

[57] ABSTRACT

A process for effectively producing an inexpensive solar cell by using a metallic substrate and growing a polycrystal semiconductor layer of a large crystal grain size. And a process for effectively producing a high quality and inexpensive solar cell by forming a polycrystal semiconductor layer of a large crystal grain size and with a reduced defect level density in grain boundaries on a polycrystal semiconductor layer of a small crystal grain size which serves as a crystal seed.

4 Claims, 9 Drawing Sheets

PROCESS FOR PRODUCING A SOLAR CELL BY MEANS OF EPITAXIAL GROWTH PROCESS

This application is a continuation of application Ser. No. 07/920,497, filed Sep. 28, 1992, which is now abandoned.

FIELD OF THE INVENTION

The present invention relates to a process for producing a solar cell having a semiconductor layer comprising high quality semiconductor crystals with a large particle size. More particularly, the present, invention relates to a process for producing a solar cell by using a metal substrate and growing polycrystals having a large particle size to form a semiconductor layer on said metal substrate without performing the transferring step to an independent substrate.

BACKGROUND OF THE INVENTION

Solar cells have been utilized as a driving energy source in various devices. Various proposals have been made for such solar cells. The proposed solar cells are of the constitution having a pn junction or a pin junction at the active portion. As the semiconductor material to constitute such junction, single crystal silicon or amorphous silicon is generally used.

As for the solar cells obtained by using a single-crystal silicon, although they are desirable since their photoelectric conversion efficiency is high, there are disadvantages that their production cost is relatively high and their mass production is difficult since it is extremely difficult to make them to be of a large area.

On the other hand, as for the solar cells obtained by using an amorphous silicon, although their photoelectric conversion efficiency is inferior to that of the solar cells obtained by using a single crystal silicon, there are advantages. In particular it is easy to make them so they have a large area, it is possible to mass-produce them, and their production cost is therefore low.

In recent years, solar cells which can be obtained by using a polycrystal silicon have been spotlighted in view that they can attain a high photoelectric conversion efficiency similar to that of the single crystal silicon solar cell and they can be provided at a reduced production cost similar to the production cost of the amorphous silicon solar cell. And not only various studies but also various proposals have been made of those polycrystal silicon solar cells.

As for the method of producing a polycrystal silicon solar cell, there is a proposal to use a plate-like material obtained by forming a lump of polycrystal silicon and slicing the lump formed. There is, however, a limit for the thickness of the plate-like material obtained in this case that is about 0.3 mm at the minimum, wherein it is extremely difficult to make the plate-like material to be of less than 0.3 mm in thickness. Because of this, the resulting polycrystal silicon solar cell unavoidably becomes such that it has an undesirably thick active region (that is, semiconductor layer) which is insufficient in material utilization, insufficient in photoelectric conversion efficiency and high in production cost.

In view of the above, various proposals have been made to form a polycrystalline silicon thin film by means of a thin film-forming technique such as a chemical vapor deposition process (CVD process). However, in any of those proposals, there are problems that the resulting film is of the order of about $10^{-2}$ micron meter in crystal grain size and a solar cell obtained by using such film is inferior to the solar cell obtained by means of the foregoing massive polycrystal silicon-slicing method in view of photoelectric conversion efficiency.

In order to solve these problems of the CVD process, there has been proposed an abnormal grain growing technique in which ions of an impurity of P or the like are implanted into a polycrystal silicon thin film formed by means of a CVD process to supersaturate the silicon thin film with said impurity and the resultant is annealed at elevated temperature to thereby enlarge the size of crystal grain about ten times over the film thickness (see, Yasuo Wada and Shigeru Nishimatsu, Journal of Electrochemical Society, Solid State Science and Technology, 125, 1499(1978)).

However, the film formed according to the proposed technique is of a remarkably high impurity concentration although it is satisfactory with respect to the crystal grain size. And a solar cell prepared by using this film is problematic in that light-induced carriers are often recombined and as a result, sufficient photocurrent is not provided.

Another attempt has been made in order to enlarge the crystal grain size of a polycrystalline silicon thin film formed by means of the CVD process has been made by subjecting the thin film to irradiation of laser beam to fuse the thin film, followed by recrystallization. However, this attempt is not practically usable since it is difficult to stably obtain a film of prescribed quality, and if a desirable film should be obtained, the resultant film unavoidably becomes costly.

The above situations are more or less the same in the case of compound semiconductors such as GaAs, ZnSe, etc.

Now, Japanese Unexamined Patent Publication Sho. 63-182872 discloses a process for producing a solar cell comprising disposing a different material on a surface of a substrate such that said different material forms a crystal nucleation surface, said different material having a nucleation density which is sufficiently greater than that of the constituent material of said surface of the substrate and being sufficiently minute to an extent that only a crystal nucleus capable of providing a single crystal can be grown after crystal growth; forming a crystal nucleus at the different material by way of deposition; growing a crystal based on the crystal nucleus to form a first conduction type semiconductor layer substantially comprised of a single crystal on said surface of the substrate; and a second conduction type semiconductor layer substantially comprised of a single crystal on said single crystal layer. This Japanese literature discloses that according to to this process, it is possible to obtain a thin solar cell with a large grain size which provides a good photoelectric conversion efficiency.

However, as for the process described in the above Japanese publication, there is a problem that because a metallic material is used as the nucleation surface on which the formation of a crystal nucleus is caused and the metallic material is used as an electrode, the constituent atoms of the metallic material are often diffused into a semiconductor layer formed to cause the formation of an alloy with the constituent atoms of the semiconductor layer, resulting in breaking the junction. Even in the case where such junction breakage does not occur, there is another problem that those diffused metallic atoms are greatly incorporated into the crystals or the crystal grain boundaries to increase the levels by which light-induced photocarriers are trapped.

Other than the above, U.S. Pat. No. 4,816,420 discloses a process of producing a solar cell by covering the surface of a single crystal silicon substrate with a mask member comprising an insulating film, lateral overgrowing single crystal silicons based on the single crystal silicons as seeds which are exposed through the spaced portions of insulating film, removing the overgrown silicon crystals from the single crystal silicon substrate, and transferring them onto a separate substrate.

However, there is a disadvantage as for this process that it is difficult to attain the production of a large area device because a single crystal silicon is used as the substrate. Particularly, in order to form a large area solar cell panel according to this process, it is necessary to provide a plurality of silicon crystals formed in the above-mentioned manner and to transfer those silicon crystals onto a separate large area substrate, and because of this, the production procedures becomes complicated and as a result, the resulting solar cell unavoidably becomes costly.

SUMMARY OF THE INVENTION

The principal object of the present invention is to eliminate the foregoing various problems in the prior art and to provide a process which makes it possible to efficiently produce a high quality polycrystal solar cell having good solar cell characteristics.

Another object of the present invention is to provide a process which makes it possible to form a high quality semiconductor crystal on a metallic surface capable of serving as an electrode without performing the transferring step to a separate substrate whereby enabling efficient production of a polycrystal solar cell having good solar cell characteristics.

A further object of the present invention is to provide a process which enables efficient growth of a high quality polycrystal semiconductor of a large crystal grain size using a metallic substrate to provide efficient production of a polycrystal solar cell having good solar cell characteristics.

A still further object of the present invention is to provide a process which enables efficient production of a polycrystal solar cell having good solar cell characteristics by forming a polycrystal semiconductor layer of a large crystal grain size on a semiconductor layer as a crystal seed while decreasing the defect level density at the grain boundaries.

The present invention has been accomplished as a result of extensive studies by the present inventors in order to solve the foregoing various problems in the prior art and in order to attain the above objects, and it relates to a process for producing a polycrystal solar cell having good solar cell characteristics.

The process for producing a polycrystal solar cell according to the present invention is of the following constitution.

That is, a process for producing a solar cell comprising the following steps (a) to (g) of:

(a) depositing a non-single crystal semiconductor layer on a metallic substrate, (b) incorporating an impurity into the non-single crystal semiconductor layer to supersaturate it with said impurity, (c) forming an insulating layer on the surface of the non-single crystal semiconductor layer, (d) subjecting the non-single crystal semiconductor layer to annealing to enlarge the grain size of crystals of the non-single crystal semiconductor layer whereby forming a polycrystal semiconductor layer, (e) providing at the insulating layer a plurality of spaced portions of a size being smaller than the mean crystal grain size of the polycrystal semiconductor layer to expose the surface of the polycrystal semiconductor layer through said plurality of spaced portions, (f) performing crystal growth through the spaced portions by means of the vapor phase crystal growing method to cause three-dimensional crystal overgrowth on the insulating layer whereby forming a plurality of semiconductor single crystallines respectively having a greater crystal grain size than the mean crystal grain size of the polycrystal semiconductor layer, and (g) forming an electrode on the plurality of semiconductor single crystallines.

The process for producing a polycrystal solar cell according to the present invention specifically comprises the following three technical constitutions.

That is, technical constitution 1: which comprises, as shown in FIGS. 2 and 3, incorporating atoms of an impurity such as P, etc. into polycrystal silicon 202 deposited on a metallic substrate 201 by way of ion implantation or thermal diffusion so that the polycrystal silicon is supersaturated with the impurity atoms, subjecting the resultant to annealing to form a polycrystal silicon layer to be an ohmic contact layer with the undercoat metal, and subjecting the crystals of the polycrystal silicon layer to abnormal crystal grain growing to thereby form a first polycrystal silicon layer (no crystal grain boundary is shown in FIG. 2); technical constitution 2: which comprises, as shown in FIGS. 4 to 6, forming an insulating layer 304 comprising, for example, an oxide film (SiO$_2$) on the surface of the first polycrystal silicon layer subjected to abnormal crystal grain growing in the above, periodically forming a minute spaced portion at the insulating layer 304 to expose the surface portions of the first polycrystal silicon layer through the minute spaced portions and forming single crystal silicon seeds at the surface of the insulating layer 304, which is incapable of serving as a crystal nucleus-forming surface; and technical constitution 3: which comprises performing selective epitaxial growth and lateral crystal growth as for each of the crystal seeds to form single crystallines of a regular crystal size whereby forming a second polycrystal silicon layer with a crystal grain size which is larger than that of the crystal grains of which the first polycrystal silicon layer is comprised.

The above three technical constitutions will be later described in more detail.

Here, a brief explanation will be made of the general principle of the selective epitaxial growing method.

The selective epitaxial growing method means a selective crystal growing method as shown in FIGS. 7 and 8 in which in the case of performing epitaxial growth by means of vapor phase epitaxy, the vapor phase epitaxy is conducted under the conditions under which the formation of a crystal nucleus is not caused on the surface of an insulating layer comprising, for example, an oxide film formed on a silicon wafer 401, wherein the epitaxial growth is performed based on an exposed silicon surface as a crystal seed situated in spaced portion 403 formed at the insulating layer 402. When the epitaxial layer embedded in the spaced portion 403 is continued growing, the crystal layer also grows laterally along the surface of the insulating layer while continuing longitudinal growth. This situation is generally called epitaxial lateral overgrowth. The ratio between the longitudinal crystal growth rate and the lateral crystal growth rate and the appearance of a facet in this case generally depend upon the film-forming conditions and the thickness of the insulating layer.

As a result of various experiments, the present inventors obtained a finding that desirable crystal growth three-dimensionally proceeds at substantially 1 of the ratio between the longitudinal crystal growth rate and the lateral crystal growth rate on the insulating layer when each of the spaced portions is made to be a minute region of a size of 9 μm or below in terms of the length of its edge, wherein distinct facets appear and angular single crystallines 404 are formed (see, FIGS. 9 and 10).

As a result of further experiments, the present inventors obtained a further finding that angular single crystallines can be formed in the same manner as in the above even in the case of using a polycrystal silicon instead of the silicon wafer as long as its crystal grain size (mean crystal grain size) is of a certain magnitude or above.

The present inventors carried out still further experiments, and as a result, there were obtained findings that in the case when the thickness of the first polycrystal silicon layer to be formed on a metallic substrate is selectively determined, it is possible to prevent metal atoms of the metallic substrate from contaminating into the second polycrystal silicon layer grown on the first polycrystal silicon layer; an intermediate layer comprising silicide, etc. is simultaneously formed to provide a desirable ohmic contact at the interface between the metallic substrate and the first polycrystal silicon layer during the step of performing abnormal growth by means of annealing; and the atoms of an impurity doped into the first polycrystal silicon layer in a high concentration can be prevented from diffusing into the second polycrystal silicon layer being grown because of the insulating layer interposed between the first polycrystal silicon layer and the second polycrystal silicon layer.

The present invention has been accomplished as a result of further research on the basis of the findings thus obtained through the experiments.

In the following, the experiments which were conducted by the present inventors will be described.

EXPERIMENT 1

(Selective Crystal Growth)

Figure 7:
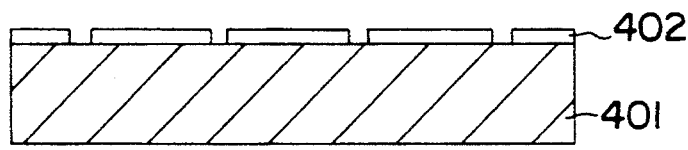
FIGS. 7 through 10 are schematic explanatory views respectively of the selective crystal growing method.
Figure 8:
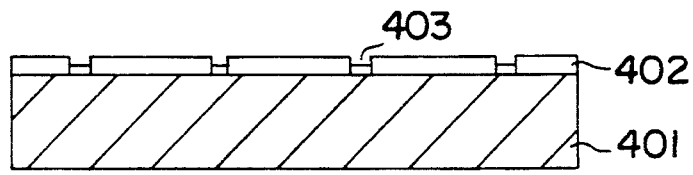
Figure 13:
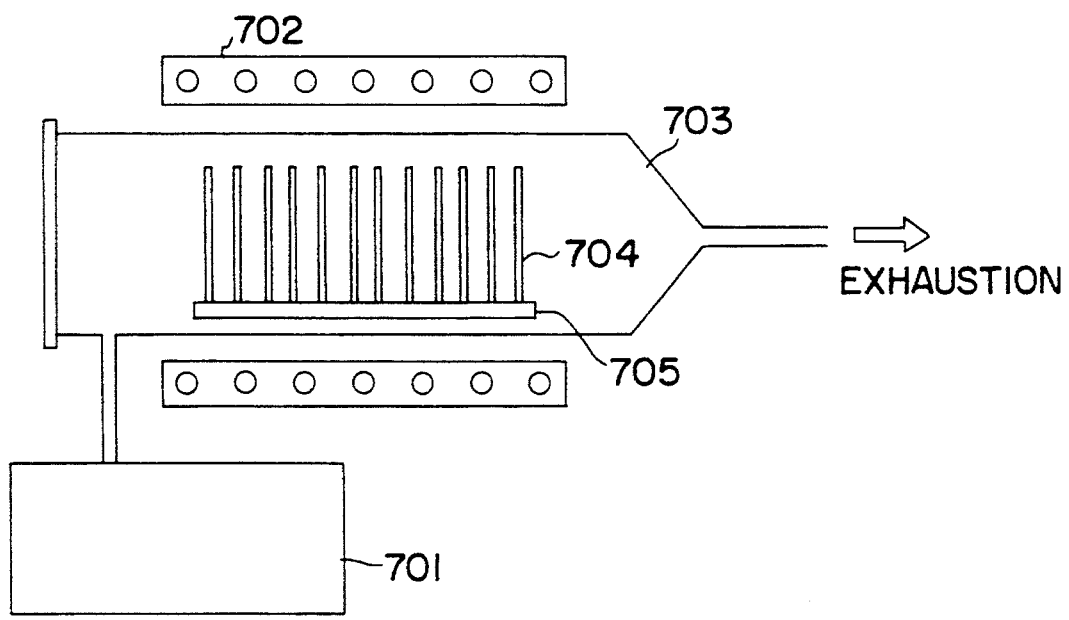
FIG. 13 is a schematic view illustrating the constitution of a low pressure CVD apparatus used in the case of practicing the process for producing a solar cell according to the present invention.

As shown in FIG. 7, on the surface of a 500 μm thick silicon wafer of (100) 401 was formed a 1000 Å thick oxide film as the insulating layer 402 by means of thermal oxidation, followed by etching using photolithography, thereby forming a plurality of spaced portions respectively in the form of a square shape in edge size $\underline{a}$ at an interval of b=50 μm. Wherein, the spaced square portions were made different into three kinds respectively with the value a being 1.2 μm, 2 μm and 4 μm. Then, selective crystal growth was performed using a conventional low pressure CVD apparatus (LPCVD apparatus) of the constitution shown in FIG. 13. In FIG. 13, numeral reference 701 stands for a gas supply system, numeral reference 702 stands for a heater, numeral reference 703 stands for a reaction vessel made of quartz, numeral reference 704 stands for a substrate, and numeral reference 705 stands for a suscepter. There were used $SiH_2Cl_2$ as the raw material gas and $H_2$ as the carrier gas, and HCl was added in order to prevent generation of a crystalline nucleus on the oxide film as the insulating layer 402. The crystal growing conditions at this time were shown in Table 1.

Figure 9:
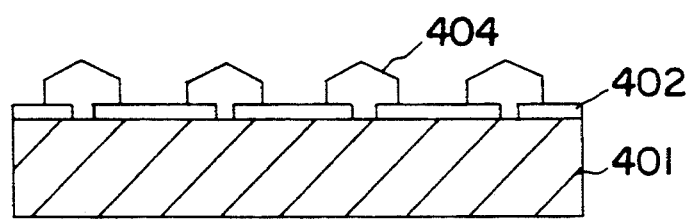
Figure 10:
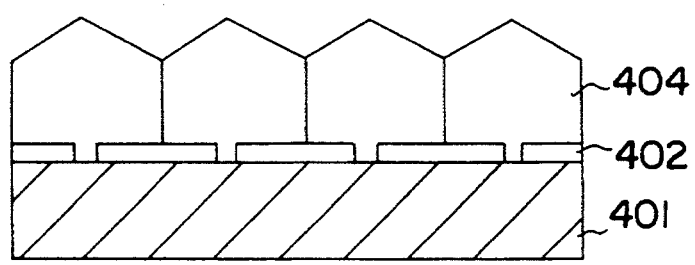
Figure 11:
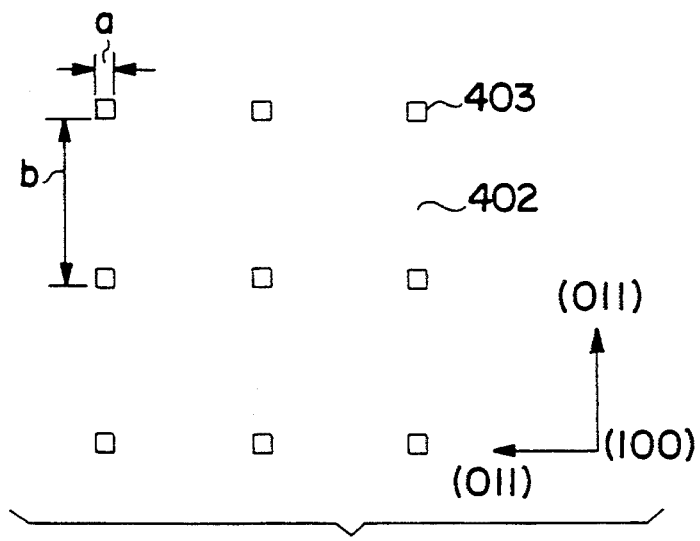
FIGS. 11 and 12 are schematic explanatory views respectively of the process wherein angular crystals are three-dimensionally grown in the selective crystal growing method.
Figure 12:
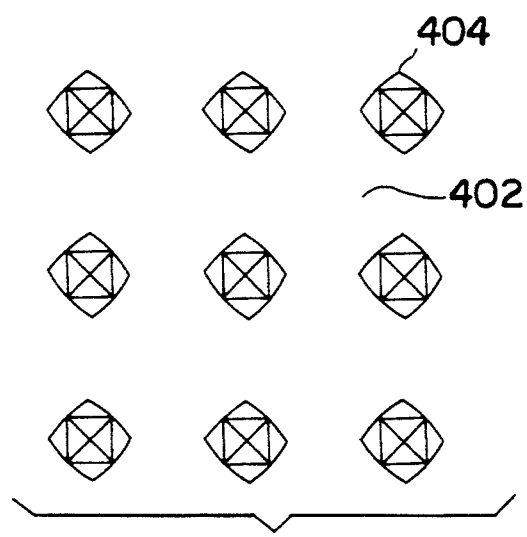

After the crystal growth was completed, the surface state of the wafer was observed by an optical microscope. As a result, it was found that single crystallines 404 respectively having an angular facet with a crystal grain size of about 20 μm with respect to the value a are regularly arranged at an interval of 50 μm respectively on the corresponding lattice point as shown in FIG. 9 or FIG. 12 and that the selective crystal growth is accomplished depending on the pattern of each of the spaced portions 403 predetermined in FIG. 11. The rate occupied by the crystal grown at each of the spaced portions in this case was found to be 100% as for each of the values of the a. In addition, it was found that the rate of the facets distinctly appeared without being deformed among the grown single-crystallines depends upon the value of the a and the rate of the deformed facets is decreased as the value of the a is lowered as shown in Table 2.

All the single crystallines obtained were found to be of a complete orientation and to succeed to the crystal orientation of the silicon wafer as the substrate.

EXPERIMENT 2

(Abnormal Crystal Grain Growth in the Polycrystal Silicon on a Metallic Substrate)

On a 0.8 mm thick chromium plate as the substrate was vacuum-evaporated a tungsten (W) film at a thickness of 1000 Å, followed by depositing a 0.4 μm thick polycrystal silicon thereon by thermally decomposing SiH$_4$ at 630° C. using a conventional low pressure CVD apparatus. The crystal grain size of the polycrystal silicon thus formed was examined by way of X-ray diffraction, and as a result, it was found to be about 80 Å.

Then, using a conventional ion implanting apparatus, P was implanted into the surface of the polycrystal silicon under the conditions of 50 KV for the accelerating voltage and $3.2 \times 10^{16}$ cm$^{-2}$ for the douse quantity to attain $8 \times 10^{20}$ cm$^{-3}$ in impurity concentration.

As for the resultant polycrystal silicon film on the metallic substrate, anneal treatment was conducted at a different temperature, and there were observed changes in the crystal grain size. The period of the anneal treatment was made constant at a period of three hours.

Figure 14:
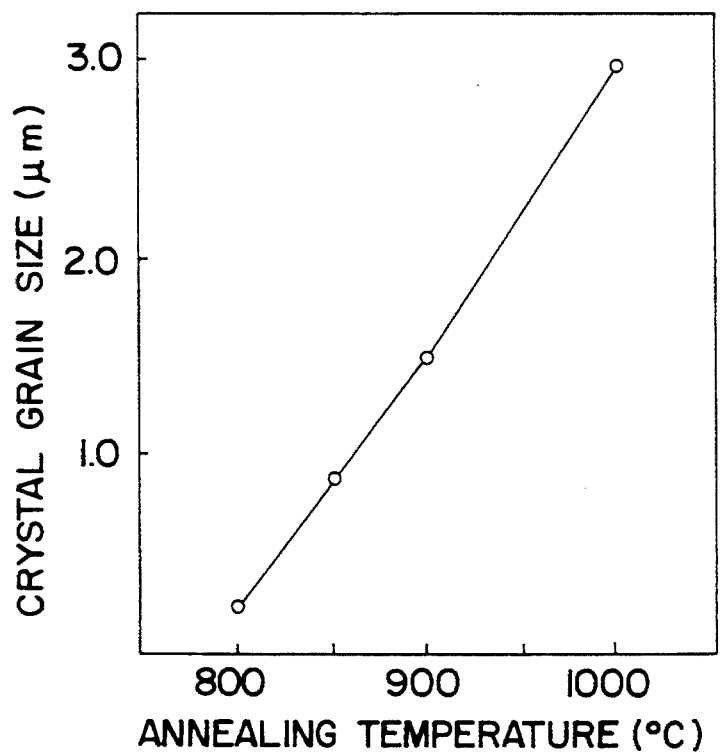
FIG. 14 is a graph showing changes in crystal grain size based on the annealing temperature upon annealing polycrystal silicon films doped with an impurity.
Figure 15:
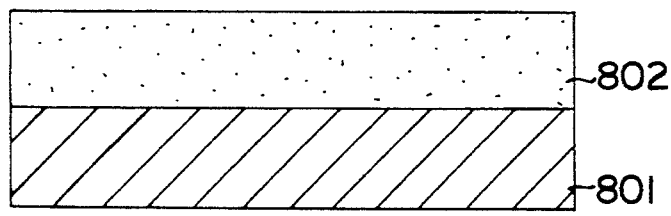
FIGS. 15 to 21 are schematic explanatory views of the production steps of a pin type solar cell according to the present invention.
Figure 16:
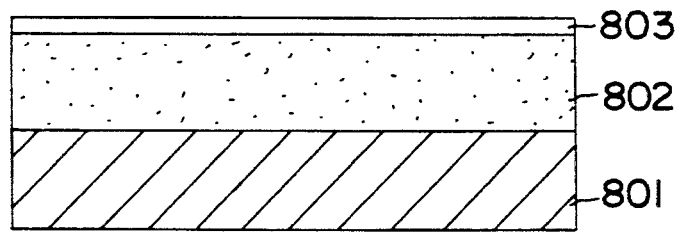
Figure 17:
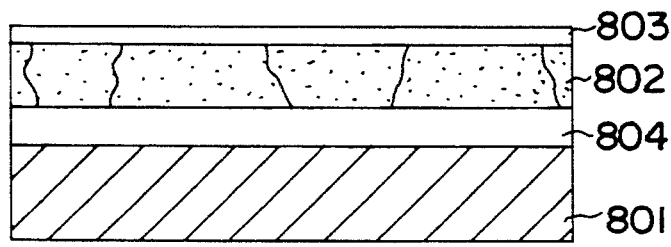
Figure 18:
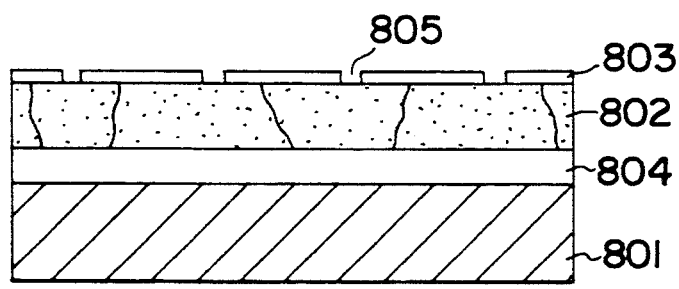
Figure 19:
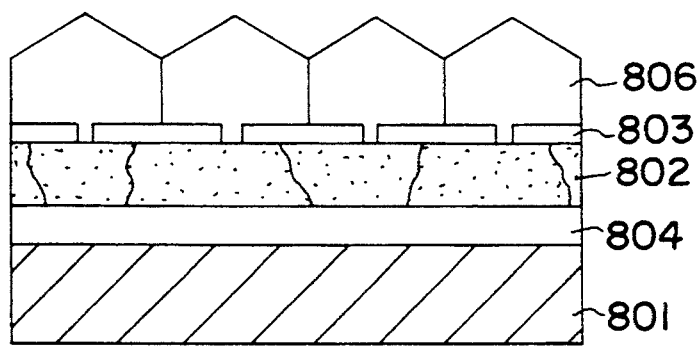
Figure 20:
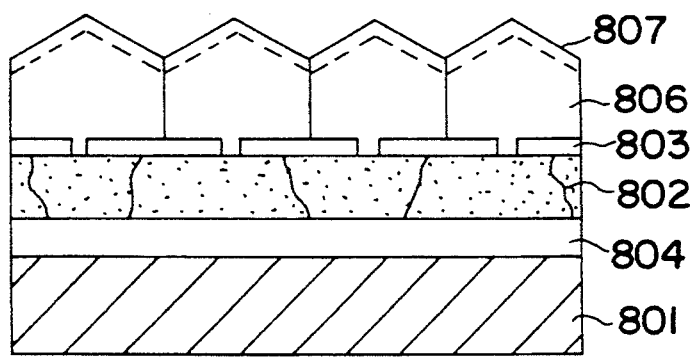
Figure 21:
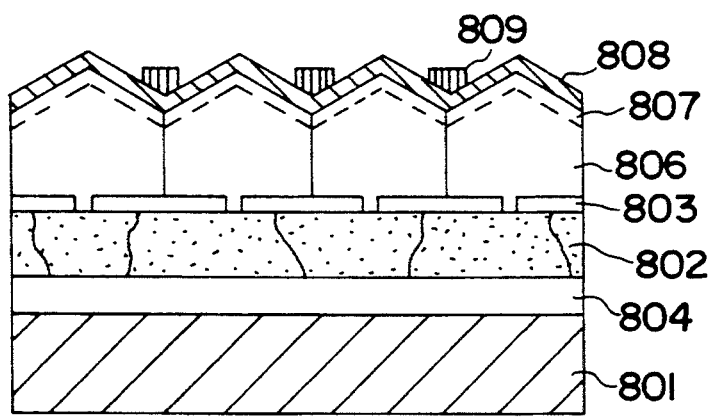
Figure 22:
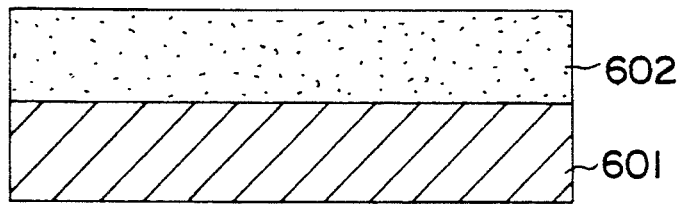
FIGS. 22 to 28 are schematic explanatory views of the production steps of a heterojunction type solar cell according to the present invention.
Figure 23:
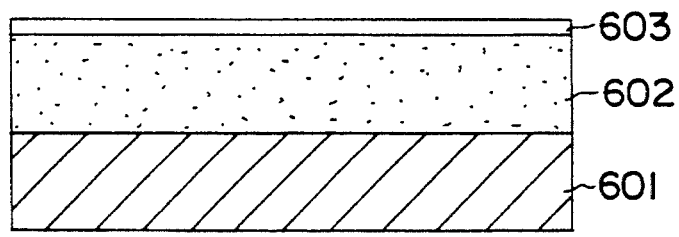
Figure 24:
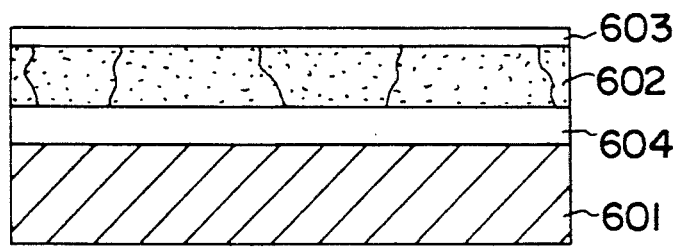
Figure 25:
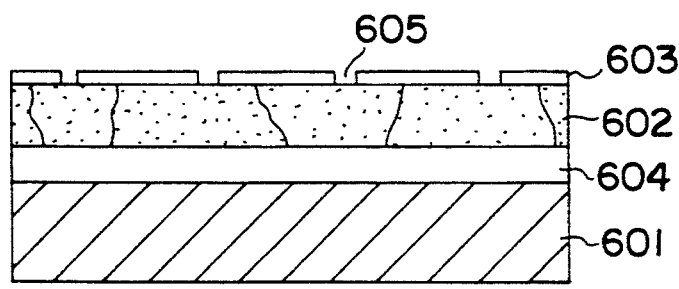

After the anneal treatment, the size of the crystal grains in the polycrystal silicon film was observed by means of a high resolution scanning electron microscope and also by the electron channeling contrast method. As a result, it was found that the crystal grain size significantly enlarges as the annealing temperature is heightened as shown in FIG. 14 and that crystal grains of about 3 μm in mean value are provided at an annealing temperature of 1000° C. In addition, the crystal orientation of those crystal grains was observed by the electron channeling pattern method, and as a result, it was found that those crystal grains are mostly oriented in the (110) direction.

Further, after the anneal treatment, the material situated in the vicinity of the interface between the metallic substrate and the polycrystal silicon was subjected to composition analysis, and as a result, it was found that tungsten silicide (W$_x$Si$_{1-x}$:0×1) had been formed at said interface as a result of the chemical reaction of W with Si. The composition of the silicide was found to be principally comprised of WSi$_2$.

EXPERIMENT 3

(Selective Crystal Growth over Metallic Substrate/Polycrystal Silicon Layer)

There was formed a polycrystal silicon layer on a metallic substrate in the same manner as in Experiment 2.

Experiments of selective crystal growth were conducted using the resultant polycrystal silicon layer.

On the surface of the first polycrystal silicon layer formed in the above manner was formed an about 1000 Å thick oxide film in the same manner as in Experiment 1, followed by etching using photolithography, thereby forming a plurality of spaced portions respectively in the form of a square shape of a=1.2 μm in edge size at an interval of b=50 μm in a lattice arrangement, wherein the surface of the first polycrystal silicon layer was exposed through the spaced portions.

Then, selective crystal growth was performed under the crystal growing conditions shown in Table 1, using the low pressure CVD apparatus shown in FIG. 13.

After the crystal growth was completed, the surface state of the first polycrystal silicon layer/oxide film was observed by an optical microscope. As a result, it was found that single crystallines or polycrystal-containing single crystallines respectively having an angular facet with a crystal grain size of about 20 μm are regularly arranged at an interval of 50 μm respectively on the corresponding lattice point as well as in the case of Experiment 1. From this, it was recognized that crystal growth had been carried out as desired.

The rate occupied by the crystal grown at each of the spaced portions in this case was found to be 100%. In addition, it was found that the proportion of the single crystals grown over the entire crystals grown was about 89%.

As for the resultant single crystallines, the situation of their orientation was examined by way of micro X-ray diffraction, and as a result, it was found that they are mostly oriented in the (110) direction. From this, it was understood that each of the single crystallines precisely succeeds through the corresponding spaced portion the orientation of the crystal grains of the first polycrystal silicon layer as the crystal seed, which is principally of (110) as described in Experiment 2.

Further, it was found that in the case where at least one of the conditions (i) and (ii) is satisfied, wherein the condition (i) is that the edge size a of the spaced portion is made to be 9 μm or below and the interval b is made equivalent to or greater than the size of a crystal grain grown through the anneal treatment and the condition (ii) is that polycrystal having a mean crystal grain size of more than about 2 times over the edge size a of the spaced portion is selectively used as the undercoat semiconductor layer, the probability of a single crystal to be grown from the crystal seed exposed through the spaced portion becomes more than 80%.

It was also found that even if there is an occasion where no single crystal is grown because of a grain boundary of the undercoat first polycrystal layer which is exposed at the spaced portion, polycrystals having a crystal grain size corresponding to about the half of a normally grown single crystal on other crystal seeds, and because of this, no negative influence is brought about to the yield and the photoelectric conversion efficiency of a solar cell to be produced.

EXPERIMENT 4

(Formation of a Continuous Film)

Following the procedures of Experiment 3, the selective crystal growth was performed for a prolonged period of 90 minutes.

As well as in the case of Experiment 3, after the crystal growth having been completed, the surface state of the polycrystal silicon/oxide film was observed by means of an optical microscope. As a result, it was found that all the adjacent crystallines are completely contacted with each other to form a second polycrystal layer (continuous film) of a large crystal grain size (about 50 μm) which is greater than that of the first polycrystal layer, said continuous film comprising lumps of single crystallines or polycrystal-partially-containing single crystallines being regularly arranged in an arrangement of a lattice as when viewed from above the substrate. The height of the continuous film was found to be about 40 μm from the surface of the oxide film.

The continuous film thus formed was polished from the surface side thereof up to the position of some micrometers distance from the surface of the oxide film, followed by measuring the profile of P-content from its surface through the oxide film by the secondary ion mass spectrometry, thereby observing the state of the impurity atoms, which were doped in the polycrystal silicon layer in a high concentration, to have been diffused into the grown crystal layer.

As a result, it was found that the P was substantially not diffused into the second polycrystal layer because of the interposition of the oxide film and that the transition region is merely of about 2000 Å. Further, as a result of examining the situation of contamination of the metal atoms into the grown layer from the substrate side, there was not detected any contamination of those metal atoms into the second polycrystal silicon layer. This was found to be due to the presence of the first polycrystal silicon layer between them.

EXPERIMENT 5

(Formation of a Solar Cell)

B was implanted into the surface of the second polycrystal silicon of a large crystal grain size obtained in Experiment 4 under the conditions of 20 KeV and $1\times 10^{15}$ cm$^{-2}$, followed by subjecting the resultant to anneal treatment at 800° C. for 30 minutes, to thereby form a p$^+$-type layer.

Thus, there was obtained a solar cell of the configuration of p$^+$-type layer/second polycrystal silicon layer of a large crystal grain size/SiO$_2$ layer/first polycrystal silicon layer of a small crystal grain size (n$^+$-type)/Cr substrate. As for the solar cell thus obtained, its I-V characteristics were observed under irradiation of AM 1.5 light (100 mW/cm$^2$). As a result, there were obtained 0.40 V for the open circuit voltage, 25 mA/cm$^2$ for the short circuit current, 0.68 for the fill factor, and 6.8% for the conversion efficiency, with respect to 0.16 cm$^2$ in cell area.

In view of the above, it was found that a desirable solar cell can be produced by using the foregoing second polycrystal silicon thin film of a large crystal grain size formed on a metallic substrate.

DETAILED DESCRIPTION OF THE PREFERRED EMBODIMENTS

The present invention has been accomplished as a result of further studies based on the technical findings obtained through the foregoing experiments.

The process for producing a solar cell according to the present invention is of the constitution described in the above. The solar cell to be produced according to the process of the present invention is of the layer configuration comprising a metallic substrate, a first polycrystal silicon layer doped with an impurity disposed on said metallic substrate, a second layer disposed on said first polycrystal silicon layer, said second layer being composed of polycrystal silicon of a crystal grain size which is greater than that of said first polycrystal silicon layer, and an insulating layer being interposed between said first and second layers.

Figure 1:
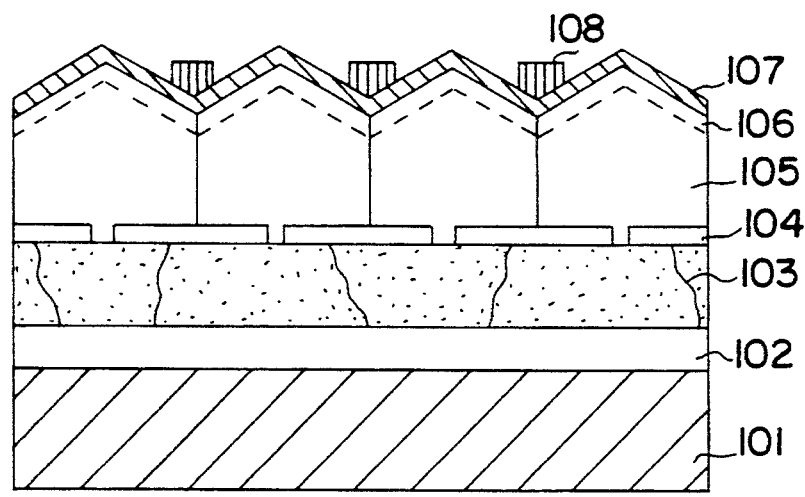
FIG. 1 is a schematic cross section view illustrating the constitution of a pin type solar cell produced according to the process of the present invention.
Figure 2:
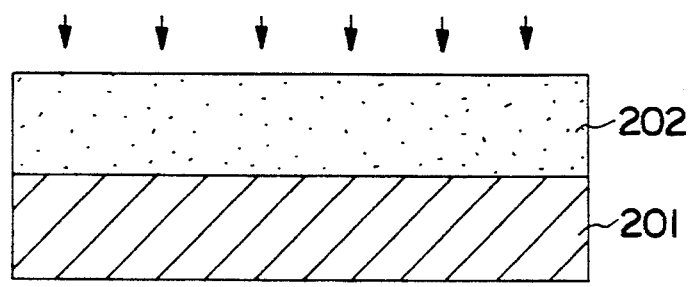
FIGS. 2 and 3 are schematic explanatory views respectively of the selective crystal growth.
Figure 3:
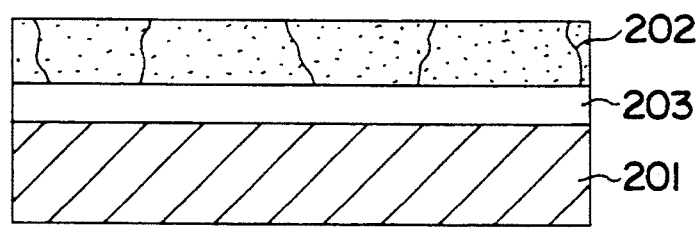
Figure 4:
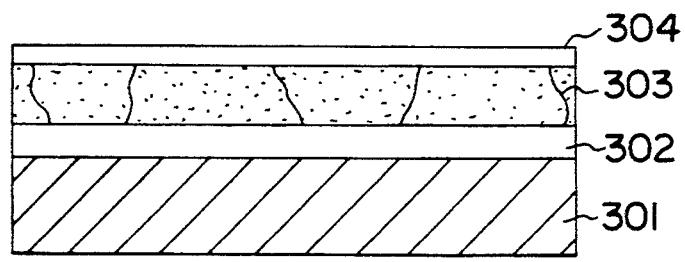
FIG. 4 is a schematic view illustrating the state in which polycrystal silicon of a large crystal grain size is grown by a selective crystal growing method wherein abnormally grown polycrystal silicon is used as a crystal seed.
Figure 5:
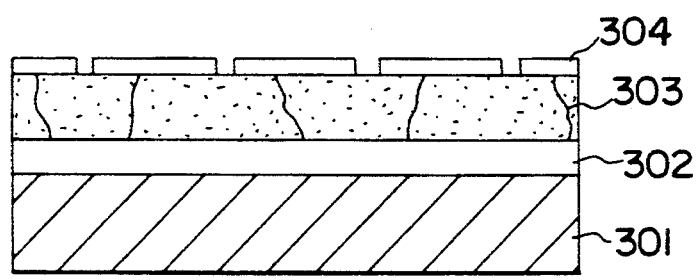
FIGS. 5 and 6 are schematic views respectively illustrating the state in which polycrystal silicon of a large crystal grain size is grown by a selective crystal growing method wherein abnormally grown polycrystal silicon is used as a crystal seed.
Figure 6:
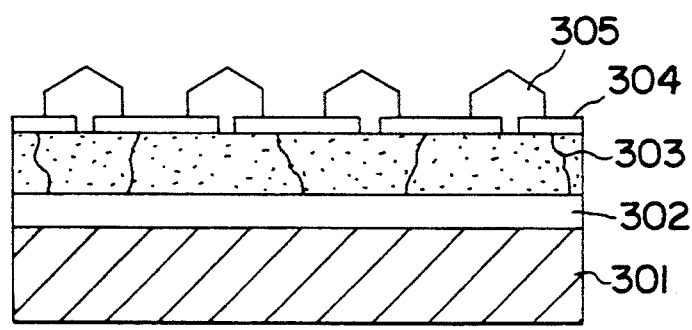

Specifically, the solar cell according to the present invention is of the configuration schematically shown in FIG. 1.

In FIG. 1, there are stacked, on a metallic substrate 101, a silicon layer containing metal atoms 102, a first polycrystal silicon layer (n$^+$-type or p$^+$-type layer) 103 doped with an impurity and of a relatively small crystal grain size, an insulating layer 104, and a second polycrystal silicon layer 105 comprising lumps of single crystals of a crystal grain size which is greater than that of said first polycrystal silicon layer. Numeral reference 106 stands for a layer of p$^+$-type or n$^+$-type disposed on the surface of the second polycrystal silicon layer 105.

On the layer 106 of p$^+$-type or n$^+$-type, there are disposed a transparent electrode 107 capable of serving as a reflection preventive film and a collecting electrode 108.

As the metallic substrate used in the solar cell of the present invention, there can be mentioned metal members having a good conductivity which are capable of forming compounds such as silicides with silicon. Specific examples of such metal member are members composed of W, Mo, Cr, or the like. Other appropriate members than these may be used as long as they have a surface applied with such metal having the above property. Relatively inexpensive members other than those metal members may be therefore used.

As for the crystal grain size of the first polycrystal silicon layer 103 of a relatively small crystal grain size, it is desired to be preferably 1 to 20 μm, or more preferably, 1.5 to 10 μm in connection with the size of the minute spaced portion (preferably, a=1 to 5 μm) provided at the insulating layer 104.

As for the thickness of the insulating layer 104, there is not any particular restriction, but in general, it is desired to be in the range of from 200 Å to 1 μm.

As for the crystal grain size and the thickness of the second polycrystal silicon layer 105 of a large crystal grain size, each of them is desired to be preferably 20 to 500 μm, or more preferably, 30 to 500 μm in view of the characteristics required for a solar cell and also in view of the restrictions in the process. The term "large crystal grain size" and the term "small crystal grain size" herein denote the magnitude of a crystal grain in comparison of the first polycrystal layer with the second polycrystal layer.

As for the thickness of the layer 106 of p$^+$-type or n$^+$-type, it depends upon the amount of an impurity to be incorporated, but in general, it is desired to be preferably in the range of from 0.05 to 1 μm, or more preferably, in the range of from 0.1 to 0.5 μm.

In the following, explanation will be made of the process for the production of a solar cell according to the present invention, while referring to the process chart shown in FIG. 15 through FIG. 21.

A polycrystal silicon layer 801 is first deposited on a metallic substrate 801 using a conventional low pressure CVD apparatus. (grain boundaries are omitted in the figure) At this time, the polycrystal silicon layer is made supersaturated with impurity atoms (for example, P in the case of making the layer to be of n-type or B in the case of making the layer to be of p-type) by doping the layer with a large amount of an impurity upon forming the layer or introducing impurity atoms in a large amount into the layer after the formation thereof by way of ion implantation or thermal diffusion. (see, FIG. 15)

Then, on the first polycrystal silicon layer 802 is formed an insulating layer 803 (comprising, for example, an oxide film which is formed by means of a conventional thermal oxidation technique or a conventional atmospheric pressure CVD technique). (see, FIG. 16)

The polycrystal silicon layer 802 is subjected to anneal treatment at a temperature of 800° to 1100° C. to cause abnormal crystal grain growth within the polycrystal silicon layer, wherein a silicon layer 104 containing metal atoms (M) (Si$_x$M$_{1-x}$, with x being $0<x<1$) is formed between the metallic substrate 801 and the first polycrystal silicon layer 802. (see, FIG. 17)

Minute spaced portions 805 are periodically formed at the insulating layer 803 so as to expose the surface of the first polycrystal silicon layer through those minute spaced portions. (see, FIG. 18)

Crystal growth is performed at each of the minute spaced portions 805 where the surface of the first polycrystal silicon layer is exposed by way of selective epitaxial growth and lateral crystal growth, which will be later described, to grow silicon crystals of a large crystal grain size whereby forming a second polycrystal silicon layer 806 comprising a continuous film. (see, FIG. 19)

On the surface of the grown crystal layer is formed a layer 807 of $p^+$-type or $n^+$-type by way of ion implantation or thermal diffusion. (see, FIG. 20)

Finally, a transparent and conductive film 808 and a collecting electrode 809 are formed. (see, FIG. 21)

The formation of the polycrystal silicon on the metallic substrate may be carried out by a conventional low pressure CVD method, plasma CVD method, vacuum evaporation method, or sputtering method. Among these methods, the low pressure CVD method is most appropriate.

The thickness of the first polycrystal silicon layer should be properly determined depending upon the factors relative to the magnitude of an abnormal crystal grain to be grown, prevention of metal atoms from being diffused from the substrate, and the like. However in general, it is desired to be in the range of from 0.1 to 1.0 μm.

In the present invention, the foregoing polycrystal silicon layer which is first formed on the substrate may be replaced by a silicon layer composed of amorphous silicon (a-Si) or microcrystal silicon (uc-Si). In this case, any of these silicon layers may be made to be a relevant first polycrystal silicon layer by incorporating an impurity thereinto and growing abnormal crystal grains therein in the same manner as in the above.

As the impurity to be incorporated into the foregoing polycrystal silicon layer or the above-mentioned silicon layer comprising a-Si or uc-Si in order to grow abnormal crystal grains within such layer, P, As and Sn are desirable in the case of making the layer to be of n-type, and B and Al are desirable in the case of making the layer to be of p-type.

As for the amount of the impurity to be incorporated, it should be properly determined depending upon the desired size of an abnormal crystal grain to be grown and the conditions for the anneal treatment. However in general, it is desired to be $4 \times 10^{20}$ cm$^{-3}$ or above.

The annealing temperature at which the foregoing silicon layer containing metal atoms is formed by means of the anneal treatment to provide an ohmic contact between the metallic substrate and the polycrystal silicon layer is lower than the annealing temperature in order to form abnormal crystal grains, and because of this, the ohmic contact is formed at the same time as the anneal treatment to form the abnormal grain crystals is conducted as above described, whereby the process is simplified. It is a matter of course that the anneal treatment and the formation of the ohmic contact may be be carried out separately one from the other.

As the insulating layer to be formed on the foregoing polycrystal silicon layer or on the above-mentioned silicon layer comprising a-Si or uc-Si in the solar cell according to the present invention, there is used a material which is inferior to silicon with respect to the nucleation density thereon, in order to prevent generation of a crystalline nucleus during the selective crystal growth. Such material can include, for example, silicon oxides such as $SiO_2$, etc. and silicon nitrides such as $Si_3N_4$, etc.

The method of performing selective crystal growth of a silicon layer of a large crystal grain size based on a polycrystal silicon formed as a result of the abnormal crystal grain growth as a crystal seed in the present invention can include a low pressure CVD method, a plasma CVD method, a light-induced CVD method, and the like. Among these methods, the low pressure CVD method is most appropriate.

As the raw material gas for selectively growing a crystal which is used in the present invention, there can be mentioned, for example, silanes such as $SiH_2Cl_2$, $SiCl_4$, $SiHCl_3$, $SiH_4$, $Si_2H_6$, $SiH_2F_2$, $Si_2F_6$, etc., and halogenated silanes.

In addition to the above raw material gas, there is added $H_2$ as a carrier gas or in order to provide a reduced atmosphere capable of promoting crystal growth.

The ratio of the amount of the raw material gas to the hydrogen gas should be properly determined depending upon the formation method, the kind of the raw material gas, the kind of the constituent material of the insulating layer, or/and the forming conditions. However, in general, it is, in terms of the flow ratio, preferably 1:10 to 1000, or more preferably 1:20 to 1:800.

In the present invention, HCl is used in order to prevent a crystalline nucleus from generating on the insulating layer. The amount of the HCl to be added to the raw material gas should be properly determined depending upon the formation method, the kind of the raw material gas, the kind of the constituent material of the insulating layer, or/and the forming conditions. However, in general, it is desired to be 1:0.1 to 1:100, or more preferably, 1:0.2 to 1:80.

As for the temperature and the pressure at which the selective crystal growth is performed in the present invention, each of them is different depending upon the formation method, the kind of the raw material gas, or/and the forming conditions including the flow ratio among the raw material gas, $H_2$ and HCl. However, in general, as for the temperature, for instance, in the case of employing the low pressure CVD method, it is desired to be controlled preferably in the range of 600° C. to 1250° C., or more preferably, in the range of 650° C. to 1200° C. In the case of employing the plasma CVD method which is a low temperature process, it is desired to be preferably 200° C. to 600° C., or more preferably, 200° C. to 500° C.

As for the pressure, it is desired to be preferably in the range of $10^{-2}$ to 760 Tort, or more preferably, in the range of $10^{-1}$ to 760 Torr.

In the case of performing the selective crystal growth by the low temperature process such as a plasma CVD method, auxiliary energy is applied in order to further promote not only the decomposition of a raw material gas but also the crystal growth in addition to the energy applied to the substrate. As such energy source, there is generally used high frequency energy in the case of employing the plasma CVD method and ultraviolet ray energy in the case of employing the light-induced CVD method. The intensity of such auxiliary energy is different depending upon the formation method and the forming conditions. However, in the case of the high frequency energy, high frequency discharging power of 20 to 100 W/cm$^2$ is desirable. In the case of the ultraviolet ray energy, energy density of 20 to 500 mW/cm$^2$ is desirable. In a more preferred embodiment, the high frequency discharging power is 30 to 100 W/cm$^2$, and the ultraviolet ray energy density is 20 to 400 mW/cm$^2$.

The polycrystal thin film to be formed according to the present invention is capable of forming a junction by doping it with an impurity either during its crystal growth or after the formation thereof. As the impurity element to be used in this case, there can be mentioned elements belonging to the group IIIA of the periodic table as the p-type impurity such as B, Al, Ga, In, etc., and elements belonging to the group VA of the periodic table as the n-type impurity such as P, As, Sb, Bi, etc., and among these elements, B, Ga, P and Sb being most appropriate. The amount of these impurities to be incorporated should be properly determined depending upon the electric characteristics as required. As for the substance containing such impurity element as its constituent (that is, impurity-imparting substance), it is desired to selectively use those compounds which are gaseous at normal temperature under normal pressure or can be easily gasified by an appropriate gasifying device.

As such compound, there can be mentioned $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. These impurity element-containing compounds may be used either singly or in combination of two or more of them.

There is not any particular restriction for the shape of the spaced portion to be formed at the insulating layer at the time of performing selective crystal growth upon practicing the process for the production of a solar cell according to the present invention, but it is desired to be in the form of a square form or a round form. As for the size of the spaced portion, since there is a tendency that the facet of the angular lump composed of single crystallines is deformed or the crystallinity of those single crystallines becomes worse in other words as the size of the spaced portion is enlarged as described in Experiment 1, it is desired to be 9 μm or below in order to prevent the facet from being deformed. Particularly, since the situation depends upon the patterning accuracy by photolithography, the value of the a is desired to be in the range of 1 μm to 5 μm in the case where the shape thereof is in the form of a square shape. As for the interval b at which the spaced portions are formed, it is desired to be controlled in the range of 10 μm to 500 μm in view of the magnitude of a crystal seed from which a crystal is grown.

There is not any particular restriction for the layer constitution of the solar cell to be produced according to the process of the present invention. The process of the present invention can be applied in the production of a solar cell of any layer constitution of Schottky type, MIS type, pn junction type, pin junction type, heterojunction type, or tandem type.

In the following, explanation will be made of the production of a solar cell in accordance with the process of the present invention with reference to examples, which are not intended to restrict the scope of the invention.

EXAMPLE 1

There was prepared a large crystal grain polycrystal silicon pin junction solar cell of the constitution shown in FIG. 1 in the same manner as in the foregoing Experiments 2 to 5. The pin junction solar cell was prepared in accordance with the production steps shown in FIGS. 15 to 21.

As the substrate, there was used a 0.9 mm thick Mo-plate. On this substrate was deposited a 0.4 μm thick polycrystal silicon by thermally decomposing $SiH_4$ at 630° C. using the low pressure CVD apparatus shown in FIG. 13.

Then, on the polycrystal silicon was deposited a phosphorous glass, followed by performing diffusion of an impurity. The conditions for depositing the phosphorous glass in this case were made as shown in Table 3. Soon after the phosphorous glass was deposited, the resultant was exposed to a gas atmosphere comprising $N_2$ for 5 minutes while maintaining the system at 950° C. The amount of P to have been introduced into the polycrystal silicon in this case was about $6 \times 10^{20}$ cm$^{-3}$.

After the impurity diffusion having been completed, the resultant was immersed in a HF aqueous solution comprising $HF:H_2O = 1:10$ to remove the phosphorous glass, followed by forming a 1000 Å thick $SiO_2$ layer on the surface of the polycrystal silicon by means of the thermal oxidation technique. The resultant was then subjected to anneal treatment at 1000° C. for 4 hours to thereby grow abnormal crystal grains. Thus, there was formed a first polycrystal silicon layer of about 3 μm in crystal grain size.

As a result of examining a separate sample obtained by repeating the above procedures, it was found that a region comprising $MoSi_2$ is formed at the interface between the metal substrate and the polycrystal silicon layer.

Spaced square portions with an edge of $a = 2$ μm were periodically formed at an interval of $b = 50$ μm at the $SiO_2$ layer, followed by performing selective crystal growth under the conditions shown in Table 4 using the low pressure CVD apparatus shown in FIG. 13, thereby forming a continuous polycrystal silicon thin film of a large crystal grain size to be a second polycrystal silicon layer. Both the crystal grain size and the thickness of the resultant silicon thin film were about 50 μm.

B was implanted into the surface of the second polycrystal silicon layer of a large crystal grain size under the conditions of 20 KeV and $1 \times 10^{15}$ cm$^{-2}$ by means of the ion implantation technique, followed by subjecting the resultant to anneal treatment at 800° C. for 30 minutes to thereby form a p$^+$-type layer.

On the p$^+$-type layer were formed a transparent and conductive film comprising ITO and a collecting electrode comprising Cr/Ag/Cr in this order by means of the electron beam evaporation technique.

Thus, there was obtained a solar cell of the configuration comprising p$^+$-type layer/large crystal grain size polycrystal silicon layer/$SiO_2$ layer/n$^+$-type small crystal grain size polycrystal silicon layer/Mo. As for the solar cell, its I-V characteristics were evaluated under irradiation of AM 1.5 light (100 mW/cm$^2$). As a result, there were obtained 0.42 V for the open circuit voltage, 26 mA/cm$^2$ for the short circuit current, 0.66 for the fill factor, and 7.2% for the conversion efficiency, with respect to 0.25 cm$^2$ in cell area.

These characteristics were repeatedly exhibited. And it was found that a variation in the solar cell characteristics among the solar cells obtained in accordance with the above procedures is markedly improved in comparison with that of solar cells obtained by growing polycrystal silicon of a large crystal grain size directly on a metal substrate without using a polycrystal silicon layer of a small crystal grain size. These situations with respect to the variation in the solar cell characteristics due to use or nonuse of a polycrystal silicon layer of a small crystal grain size are shown in Table 5.

In view of the above, it was recognized that a desirable polycrystal solar cell excelling in solar cell characteristics can be effectively obtained in the case of using such silicon layer with a large crystal grain size grown on a metal substrate.

EXAMPLE 2

Lumps of single crystallines were formed in the same manner, and there was eventually obtained an amorphous silicon carbide/polycrystal silicon heterojunction solar cell. Particularly, as the metallic substrate, there was used a Cr-plate. On the substrate was deposited a 0.4 μm thick microcrystals-containing a first silicon layer by decomposing a raw material gas comprising $SiH_4 + AsH_3$ by means of the plasma CVD technique, wherein the doping amount was made to be $AsH_3/SiH_4 = 1.6 \times 10^{-2}$ (flow ratio).

On the silicon layer was formed a 500 Å thick $SiO_2$ film by means of the atmospheric pressure CVD technique. Spaced square portions with an edge size of a=1.2 μm were periodically formed at an interval of b=50 μm at the $SiO_2$ layer. Then, elective crystal growth was performed under the conditions shown in Table 6 by means of the low pressure CVD technique to thereby form a second silicon layer of a large crystal grain size.

Figure 26:
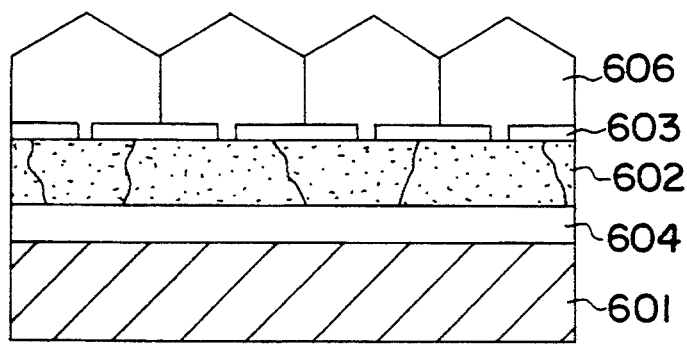
Figure 27:
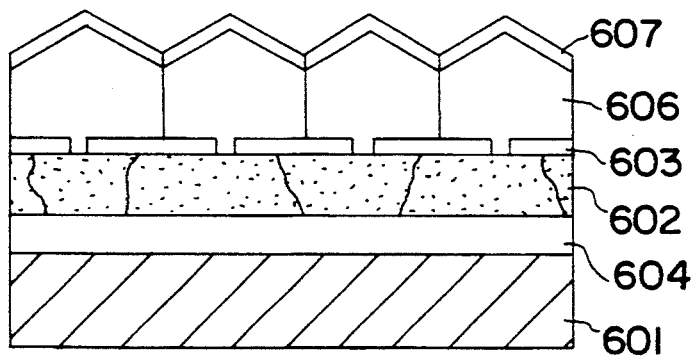
Figure 28:
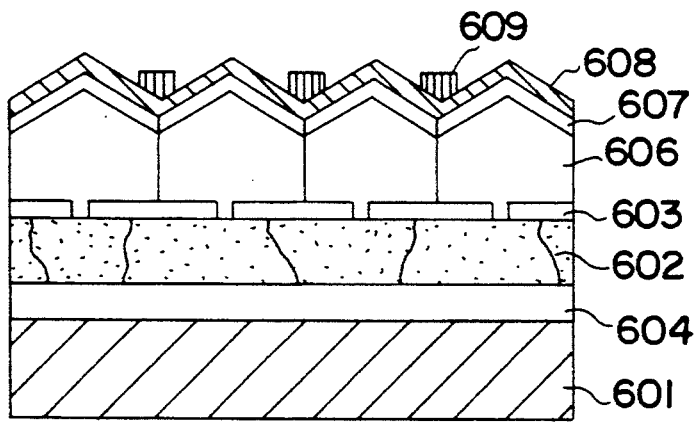

The production steps of obtaining the heterojunction solar cell in this example were illustrated in FIGS. 22 to 28, in which crystal grain boundaries are omitted in the layer 602. The production steps are the same as the production steps in Example 1, except for the following point. That is, as shown in FIG. 26, instead of the p+-type layer 807, a p-type amorphous silicon carbide layer 607 was formed on the polycrystal silicon layer.

Following the above procedure, a p-type amorphous silicon carbide layer 607 was formed on the polycrystal silicon layer 606. Particularly, the p-type amorphous silicon carbide layer 607 was formed at a thickness on the surface of the polycrystal silicon layer under the conditions shown in Table 6, using a conventional plasma CVD apparatus. The amorphous silicon carbide film in this case was found to be about $10^{-2}$ S.cm$^{-1}$ in dark conductivity, and the composition ratio of C to Si in the film was found to be 2:3.

Then, as the transparent and conductive film 608, there was formed an about 1000 Å thick film of ITO by means of the electron beam evaporation technique.

Thus, there was obtained a heterojunction solar cell comprising amorphous silicon carbide/polycrystal silicon. As for the solar cell, its I-V characteristics were evaluated under irradiation of AM 1.5 light (100 mW/cm$^2$) (with respect to 0.16 cm$^2$ in cell area). As a result, there were obtained a high value in each of the evaluation items, that is, 0.49 V for the open circuit voltage, 21.5 mA/cm$^2$ for the short circuit current, 0.55 for the fill factor, and 5.8% for the conversion efficiency. These values are quite similar to those of the known amorphous silicon carbide/polycrystal silicon heterojunction solar cell provided with a sliced polycrystal substrate.

EXAMPLE 3

There was prepared a pin junction solar cell of the constitution shown in FIG. 1 in the same manner as in Example 1. Particularly, on a Mo-substrate was deposited a polycrystal silicon, followed by depositing a phosphorous glass on the surface of the polycrystal silicon, and diffusion of an impurity was performed. The phosphorous glass was removed using a HF aqueous solution. Then, instead of the $SiO_2$ layer, a 1000 Å thick $Si_3N_4$ layer was formed on the surface of the polycrystal silicon using a conventional low pressure CVD apparatus. The resultant was then subjected to anneal treatment at 1050° C. for 3 hours to thereby grow abnormal crystal grains. Thus, there was formed a first polycrystal silicon layer of about 3.2 μm in crystal grain size.

Spaced square portions with an edge of a=1.2 μm were periodically formed at an interval of b=100 μm at the $Si_3N_4$ layer, followed by performing selective crystal growth under the conditions shown in Table 7 using the low pressure CVD apparatus shown in FIG. 13, whereby forming a continuous polycrystal silicon thin film of a large crystal grain size to be a second polycrystal silicon layer. In this case, during the selective crystal growth under the conditions shown in Table 7, the resulting layer was doped with an impurity in a slight amount. $PH_3$ was used as the impurity-imparting raw material gas, and its flow ratio to $SiH_2Cl_2$ as the raw material gas was made to be $PH_3/SiH_2Cl_2 = 2 \times 10^{-6}$. Both the crystal grain size and the thickness of the resultant silicon thin film were about 90 μm.

In order to form the p+-type layer, an Al film was vacuum evaporated onto the surface of the large crystal grain size silicon, followed by subjecting the resultant to rapid thermal anneal treatment. In this case, the thickness of the Al film was 600 Å, and the rapid thermal anneal treatment was conducted at 800° C. for 15 seconds.

On the p+-type layer was formed an about 1000 Å thick ITO transparent and conductive film capable of serving also as a reflection preventive film by means of the electron beam evaporation technique, and a 1 μm thick Cr collecting electrode was provided thereon by means of the vacuum evaporation technique.

Thus, there was obtained a pin junction solar cell. As for the solar cell, its I-V characteristics were evaluated under irradiation of AM 1.5 light. As a result, there were obtained 0.47 V for the open circuit voltage, 28 mA/cm$^2$ for the short circuit current, 0.67 for the fill factor, and a high conversion efficiency of 8.8%, with respect to 0.16 cm$^2$ in cell area.

EXAMPLE 4

There was prepared a pin junction solar cell of the constitution shown in FIG. 1 in the same manner as Examples 1 to 3. On a Cr substrate was deposited a 0.4 μm thick polycrystal silicon by thermally decomposing SiH$_4$ at 630° C. using the low pressure CVD apparatus shown in FIG. 13. B was implanted into the surface of the polycrystal silicon under the conditions of 20 KeV in implantation energy and $2 \times 10^{16}$ cm$^{-2}$ in douse amount by means of the ion implantation technique so that the impurity concentration became $5 \times 10^{20}$ cm$^{-3}$.

Then, a 800 Å thick $SiO_2$ film was deposited using a conventional atmospheric pressure CVD apparatus, followed by subjecting the resultant to anneal treatment at 1000° C. for 5 hours to thereby grow abnormal crystal grains within the polycrystal silicon, thereby forming a first polycrystal silicon layer.

Subsequently, spaced square portions with an edge of a=1.2 μm were periodically formed at an interval of b=50 μm at the SiO2 layer, followed by performing selective crystal growth under the conditions shown in Table 4 by means of the low pressure CVD technique, whereby forming a thin film layer to be a second polycrystal silicon layer of a large crystal grain size. Then, P was implanted into the surface of the polycrystal silicon layer of a large crystal grain size under the conditions of 50 KeV and $1 \times 10^{15}$ cm$^{-2}$ by means of the ion implantation technique, followed by subjecting the resultant to anneal treatment at 800° C. for 30 minutes to thereby form a n+-type layer.

Lastly, there were formed an ITO film and a collecting electrode in the same manner as in Example 4. Thus, the procedures of producing a solar cell were completed.

As for the nip junction solar cell thus obtained, its I-V characteristics were evaluated under irradiation of AM 1.5 light. As a result, there were obtained 0.46 V for the open circuit voltage, 26 mA/cm² for the short circuit current, 0.69 for the fill factor, and 8.3% for the conversion efficiency, with respect to 0.16 cm² in cell area.

As apparent from what is described above, it is understood that according to the present invention, a desirable mass-productive solar cell can be effectively produced singe it is possible to form a high quality polycrystal silicon layer on a metallic substrate by using a polycrystal silicon layer of a small crystal grain size and forming a polycrystal silicon layer of a large crystal grain size on the polycrystal silicon layer of a small crystal grain size which serves as a crystal seed.

As above described, according to the present invention, it is possible to form a high quality polycrystal solar cell on a metallic substrate, and because of this, it is possible to commercialize a high quality solar cell with a mass-productivity at a reduced production cost.

TABLE 1

| gas flow rate (l/min) | substrate temperature (°C.) | pressure (Torr) | growth period (min) |
|---|---|---|---|
| SiH2Cl2/HCl/H2 = 0.52/2.0/100 | 1030 | 80 | 20 |

TABLE 2

| a (μm) | 1.2 | 2 | 4 |
|---|---|---|---|
| facet rate (%) | 96.4 | 93.1 | 84.6 |

TABLE 3

| gas | | | temperature | time |
|---|---|---|---|---|
| N2 | 2.0 | l/min | 950° C. | 13 min |
| O2 | 0.125 | l/min | | |
| POCl3 | 80 | mg/min | | |

TABLE 4

| gas flow rate (l/min) SiH2Cl2/HCl/H2 = | substrate temperature (°C.) | pressure (Torr) | growth period (min) |
|---|---|---|---|
| 0.53/2.0/100 | 950 | 100 | 20 |
| ↓ | ↓ | ↓ | ↓ |
| 0.53/1.6/100 | 950 | 100 | 40 |
| ↓ | ↓ | ↓ | ↓ |
| 0.53/2.0/100 | 1060 | 100 | 90 |
| ↓ | ↓ | ↓ | ↓ |

TABLE 4-continued

| gas flow rate (l/min) SiH2Cl2/HCl/H2 = | substrate temperature (°C.) | pressure (Torr) | growth period (min) |
|---|---|---|---|
| 0.53/0.5/100 | 1060 | 100 | 10 |

TABLE 5

| polycrystal layer of a small crystal grain size | a variation based on the mean value |
|---|---|
| used | ±6% |
| not used | not less than ±90% |

TABLE 6

| gas flow rate | substrate temperature | pressure | discharging power |
|---|---|---|---|
| SiH4/CH4 = 0.8 cc/0.2 cc B2H6/SiH4 = $1.5 \times 10^{-2}$ | 350° C. | 0.5 Torr | 8W |

TABLE 7

| gas flow rate (l/min) SiH2Cl2HCl/H2 = | substrate temperature (°C.) | pressure (Torr) | growth period (min) |
|---|---|---|---|
| 0.53/2.0/100 | 950 | 100 | 20 |
| ↓ | ↓ | ↓ | ↓ |
| 0.53/1.6/100 | 950 | 100 | 50 |
| ↓ | ↓ | ↓ | ↓ |
| 0.53/2.0/100 | 1060 | 100 | 130 |
| ↓ | ↓ | ↓ | ↓ |
| 0.53/0.5/100 | 1060 | 100 | 30 |

We claim:

1. A process for producing a solar cell, said process comprises the steps of:
   forming a non-single crystal semiconductor layer,
   incorporating an impurity into said non-single crystal semiconductor layer to supersaturate said non-single crystal semiconductor layer with said impurity,
   forming an insulating layer on said non-single crystal semiconductor layer,
   annealing said non-single crystal semiconductor layer to enlarge crystal grains of said non-single crystal semiconductor layer to form an annealed polycrystalline semiconductor layer having enlarged crystal grains,
   forming laterally spaced openings in said insulating layer which expose the surface of said annealed polycrystalline semiconductor layer wherein the largest lateral dimension of the openings is less than the mean crystal grain size of said annealed polycrystalline semiconductor layer,
   performing crystal growth from each of said openings by a vapor phase crystal growing method to cause overgrowth of crystals grown over said insulating layer thereby forming a plurality of semiconductor single crystal growths with a crystal grain size which is greater than the means crystal grain size of said firstly formed annealed polycrystalline semiconductor layer, and
   forming an electrode over said plurality of semiconductor single crystal growths.

2. The process for forming a solar cell according to claim 1, wherein the mean crystal grain size of the plurality of semiconductor single crystal growths is 20 μm to 500 μm.

3. The process for forming a solar cell according to claim 1, wherein the mean crystal grain size of the annealed polycrystalline semiconductor layer is 1 μm to 20 μm.

4. The process for forming a solar cell according to claim 1, 2 or 3, wherein the annealed polycrystalline semiconductor layer is a polycrystalline silicon layer which contains impurity atoms in an amount of $4 \times 10^{20}$ cm$^{-3}$ or above.

* * * * *

UNITED STATES PATENT AND TRADEMARK OFFICE
CERTIFICATE OF CORRECTION

PATENT NO. : 5,403,771
DATED : April 4, 1995
INVENTOR(S) : SHOJI NISHIDA, ET AL.

It is certified that error appears in the above-identified patent and that said Letters Patent is hereby corrected as shown below:

ON TITLE PAGE

In [56] References Cited, under FOREIGN PATENT DOCUMENTS:
"3160763  7/1991  Japan" should read
--3-160763  7/1991  Japan--.

COLUMN 1

Line 38, "particular" should read --particular,--.

COLUMN 2

Line 52, "to" (second occurrence) should be deleted.

COLUMN 3

Line 19, "becomes" should read --become--.

COLUMN 8

Line 51, "having been" should read --was--.
Line 61, "as" should be deleted.

COLUMN 10

Line 48, "(grain" should read --(Grain--.
Line 49, "figure)" should read --figure.)--.

COLUMN 11

Line 63, "be" (second occurrence) should be deleted.

UNITED STATES PATENT AND TRADEMARK OFFICE
CERTIFICATE OF CORRECTION

PATENT NO. : 5,403,771
DATED : April 4, 1995
INVENTOR(S) : SHOJI NISHIDA, ET AL.

Page 2 of 2

It is certified that error appears in the above-identified patent and that said Letters Patent is hereby corrected as shown below:

<u>COLUMN 12</u>

Line 55, "Tort," should read --Torr,--.

<u>COLUMN 17</u>

Line 28, "singe" should read --since--.

<u>COLUMN 18</u>

Line 52, "means" should read --mean--.

Signed and Sealed this

Eighteenth Day of July, 1995

Attest:

BRUCE LEHMAN

*Attesting Officer*  *Commissioner of Patents and Trademarks*